United States Patent
Chen et al.

(10) Patent No.: US 7,581,160 B2
(45) Date of Patent: *Aug. 25, 2009

(54) ACS CIRCUIT AND VITERBI DECODER WITH THE CIRCUIT

(75) Inventors: Hong-Ching Chen, Feng Shan (TW); Wen-Zen Shen, Hsin Chu (TW); Der-Tsuey Shen Wang, legal representative, Hsin Chu (TW)

(73) Assignee: MediaTek Inc., Hsin Chu (TW)

( * ) Notice: Subject to any disclaimer, the term of this patent is extended or adjusted under 35 U.S.C. 154(b) by 313 days.

This patent is subject to a terminal disclaimer.

(21) Appl. No.: 11/527,676

(22) Filed: Sep. 27, 2006

(65) Prior Publication Data

US 2007/0044008 A1 Feb. 22, 2007

Related U.S. Application Data

(63) Continuation of application No. 10/412,339, filed on Apr. 14, 2003, now Pat. No. 7,127,667.

(30) Foreign Application Priority Data

Apr. 15, 2002 (TW) .............................. 91107672 A

(51) Int. Cl.
*H03M 13/41* (2006.01)
(52) U.S. Cl. ...................................... 714/795
(58) Field of Classification Search ................. 714/795; 341/59; 369/59.22
See application file for complete search history.

(56) References Cited

U.S. PATENT DOCUMENTS

| | | | |
|---|---|---|---|
| 4,612,659 A | 9/1986 | Starke | |
| 4,630,295 A | 12/1986 | Kamuro et al. | |
| 5,280,489 A * | 1/1994 | Fredrickson et al. | 714/788 |
| 5,430,744 A | 7/1995 | Fettweis et al. | |
| 5,588,011 A * | 12/1996 | Riggle | 714/792 |
| 5,719,843 A | 2/1998 | Nakajima et al. | |
| 5,729,517 A | 3/1998 | Fujiwara et al. | |
| 5,799,046 A | 8/1998 | Hayashi | |
| 5,815,515 A | 9/1998 | Dabiri | |
| 5,835,510 A | 11/1998 | Hayashi | |
| 5,928,378 A | 7/1999 | Choi | |
| 5,940,416 A | 8/1999 | Nishiya et al. | |
| 5,987,638 A | 11/1999 | Yu et al. | |
| 6,111,835 A | 8/2000 | Honma | |
| 6,148,431 A | 11/2000 | Lee et al. | |

(Continued)

*Primary Examiner*—Stephen M Baker
(74) *Attorney, Agent, or Firm*—Muncy, Geissler, Olds & Lowe, PLLC

(57) ABSTRACT

An ACS circuit and a Viterbi decoder with the circuit. The Add-Compare-Select (ACS) circuit comprises: two registers for storing two previous candidate state metrics; a first adder for adding the value stored in the first register and a first branch metric to generate a first addition result; a second adder for adding the value stored in the second register and the first branch metric to generate a second addition result; a comparator for comparing the values stored in the first register and the second register to generate a decision bit; and a multiplexer for selecting either the first addition result or the second addition result as a new output candidate state metric according to the decision bit. Due to the parallel processing of the adders and the comparator, the processing speed of a Viterbi decoder with the ACS will be increased.

8 Claims, 9 Drawing Sheets

U.S. PATENT DOCUMENTS

| | | |
|---|---|---|
| 6,298,464 B1 | 10/2001 | Tong et al. |
| 6,477,661 B2 | 11/2002 | Yamanaka et al. |
| 6,532,337 B1 | 3/2003 | Yoshinaka |
| 6,667,841 B2 * | 12/2003 | Taguchi et al. ................. 360/46 |
| 6,738,941 B1 * | 5/2004 | Todoroki ..................... 714/755 |
| 6,785,212 B1 * | 8/2004 | Sim et al. ................... 714/795 |
| 6,792,571 B2 | 9/2004 | Shieh |
| 6,798,726 B2 | 9/2004 | Redman-White et al. |
| 6,799,296 B2 * | 9/2004 | Kong et al. .................. 714/795 |
| 7,127,667 B2 * | 10/2006 | Chen et al. ................... 714/795 |
| 2002/0094057 A1 | 7/2002 | Shibuya |
| 2002/0122480 A1 | 9/2002 | Abnous et al. |
| 2002/0174402 A1 | 11/2002 | Yamamoto |
| 2003/0196163 A1 | 10/2003 | Chen et al. |
| 2004/0044946 A1 | 3/2004 | Bickerstaff et al. |
| 2008/0072129 A1 | 3/2008 | Yamanaka et al. |

\* cited by examiner

ACS CIRCUIT AND VITERBI DECODER WITH THE CIRCUIT

This application is a Continuation of application Ser. No. 10/412,339, filed on Apr. 14, 2003, now U.S. Pat. No. 7,127,667, the entire contents of which are hereby incorporated by reference and for which priority is claimed under 35 U.S.C. § 120.

BACKGROUND OF THE INVENTION

1. Field of the Invention

The invention relates to an ACS (Add-Compare-Select) circuit, and in particular to an ACS circuit, in which an adder and a comparator are processing in parallel to increase the processing speed thereof, thereby increasing the processing speed of a Viterbi decoder with the ACS circuit.

2. Description of the Related Art

A PRML (Partial Response Maximum Likelihood) system is used to retrieve EFM (Eight-to-Fourteen Modulation) signals from CD (Compact Disc)/DVD (Digital Versatile Disk). In the PRML system, a Viterbi decoder is usually used to realize the maximum likelihood detection.

FIG. 1(A) is a block diagram showing a conventional Viterbi decoder. Referring to this drawing, a Viterbi decoder typically includes a branch metric generator 11, an ACS (Add-Compare-Select) unit 12, and a survivor path memory and decoding unit 13. The branch metric generator 11 calculates the metrics corresponding to each branch according to the received data, and outputs them to the ACS unit 12. The branch metric generator 11 calculates the distance, such as mean-square-distance, between the received data and the estimated data of the branch. For each state, the ACS unit 12 adds the branch metrics of input branches with the related state metric to generate the candidate state metrics, compares and selects the minimum of the candidate state metrics as the new state metric. The decision bit of the ACS unit 12, indicating the decision of the state-metric selection, is sent to the survivor path memory and decoding unit 13. According to the decision bit, the survivor paths of the survivor path memory and decoding unit 13 are updating to keep consistent with the selected result of related state metric. The survivor memory and decoding unit 13 restores the decoded results corresponding to each state, and a decoding unit executes the majority vote for the ending bits of all survivor paths to decide the output decoded result.

FIG. 1(B) is an architecture diagram showing an ACS processor in the ACS unit of FIG. 1(A), wherein $SM_i(n-1)$ and $SM_j(n-1)$ are state metrics of state $S_i$ and state $S_j$ at time n−1, respectively, and $BM_{i,k}(n-1)$ and $BM_{j,k}(n-1)$ are branch metrics from state $S_i$ to state $S_k$ at time n−1 and from state $S_j$ to state $S_k$ at time n−1, respectively. The $SM_k(n)$ is a state metric at time n and the $BM_{k,m}(n)$ is the branch metric from state $S_k$ to state $S_m$ at time n. In this drawing, it illustrates that the ACS processor is used to select the survivor state metric from either state $S_i$ or state $S_j$. As shown in the drawing, an ACS processor 14 in an ACS unit 12 includes two adders 15, 15', a comparator 16, and a selector 17. The ACS processor 14 employs the adder 15 to add $SM_i(n-1)$ to $BM_{i,k}(n-1)$ to generate a first candidate state metric, and the adder 15' to add $SM_j(n-1)$ to $BM_{j,k}(n-1)$ to generate a second candidate state metric. Then, the ACS processor 14 employs the comparator 16 and selector 17 to compare the first candidate state metric with the second candidate state metric, and select the minimum to be outputted to a state register 18 as the $SM_k(n)$. The comparison result, serving as a decision bit, is outputted to the survivor memory and decoding unit 13. The adder 19 belongs to another ACS processor 14'.

FIG. 2(A) shows a 4-state trellis diagram, and FIG. 2(B) is a block diagram showing the ACS unit 12 in the Viterbi decoder corresponding to the trellis diagram of FIG. 2(A). Since FIG. 2(A) is a 4-state trellis diagram, the ACS unit 12 includes four ACS processors 121 to 124 and four state registers 125 to 128 for storing the state metrics $S_0$ to $S_3$, as shown in FIG. 2(B). In addition to transferring the generated metrics back to the state registers 125 to 128, the ACS processors 121 to 124 of the ACS unit 12 further output decision bits to the survivor memory and decoding unit 13. The ACS processor 121 receives the state metrics from the state registers 125 and 127, adds together the state metrics and the related branch metrics, selects a smaller addition result as a survivor metric, stores back to the state register 125, and outputs the comparison value (logic 1 or logic 0) serving as a decision bit simultaneously. The ACS processor 122 receives the state metrics from the state register 125 and 127, adds together the state metrics and the related branch metrics, selects a smaller addition result as a survivor metric, stores back to the state register 126, and outputs a comparison value (logic 1 or logic 0) serving as a decision bit simultaneously. The processing methods for the ACS processors 123 and 124 are also the same.

FIG. 3 shows a circuit of the ACS processor as shown in FIG. 2(B). Referring to FIG. 3, the ACS processor 121 includes two adders 1211, 1211', a comparator 1212 and a multiplexer 1213. The adders 1211, 1211' are used to add together the branch metric and the state metric, and the comparator 1212 is used to compare two output values from the adders 1211, 1211'. The multiplexer 1213 selects a value from the output values of the two adders 1211, 1211' as a new state metric according to the comparison result of the comparator 1212. Meanwhile, the comparison result of the comparator 1212 also serves as a decision bit for output. From FIG. 1(B) and FIG. 3, it is shown that the execution order of the ACS processor is Add→Compare→Select. Because the execution of comparison needs to wait the result of addition, the addition and comparison cannot be executed in parallel, which is a timing bottleneck of a conventional ACS unit.

In the application of decoding an EFM signal, the EFM signal has the property of run length limited (RLL) that the minimum run length of an EFM signal is 3 T, where T is a recording unit length. When decoding with respect to the EFM signal, a simplified trellis diagram can be obtained according to the RLL of the EFM signal, as shown in FIG. 4(A). That is, the trellis diagram has six states including state $S_0(000)$, state $S_1(001)$, state $S_2(011)$, state $S_3(100)$, state $S_4(110)$, and state $S_5(111)$, in which the states of (010) and (101) are invalid and not listed due to the minimum run length of 3 T. In addition, state $S_1(001)$, state $S_2(011)$, state $S_3(100)$ and state $S_4(110)$ only have a branch. FIG. 4(B) is a schematic illustration showing the branch values corresponding to the trellis diagram of FIG. 4(A). The Viterbi decoder generates all possible input sequences from the trellis diagram, and selects the most possible result as the decoded result. According to the trellis diagram of FIG. 4(A), only state $S_0$ and state $S_5$ receive two input values, so the state $S_0$ and state $S_5$ have to judge and select one of the input sequences.

FIG. 5 is an architecture diagram showing a Viterbi decoder applied to the trellis diagram of FIG. 4(A). Referring to the drawing, the Viterbi decoder includes an ACS unit 52 and a survivor memory and decoding unit 13. Because the trellis diagram has already been simplified due to the property of RLL, the ACS unit 52 only includes two ACS processors 521 and 522, two adders 523 and 524, and six registers 525 to 530. The ACS processor 521 receives the state metrics of state $S_0$ and state $S_3$, adds together the state metrics and the related branch metrics, selects a smaller result through the compare-select circuit 5211, and stores the selected result back to the register 525 at state S0. Next, the ACS processor 521 outputs the comparison value, serving as a decision bit, from the compare-select circuit 5211 to the multiplexers in the path 0 of the survivor memory and decoding unit 13. The ACS processor 522 receives the state metrics of state S2 and state S5, adds together the state metrics and the branch metrics, selects a smaller result through the compare-select circuit 5221, and stores the selected result back to the register 530 at state S5. Next, the ACS processor 522 outputs the comparison value, serving as a decision bit, from the compare-select circuit 5221 to the multiplexers in the path 5 of the survivor memory and decoding unit 13. Since the trellis diagram has been simplified, the multiplexers are only arranged in path 0 and path 5 of the survivor memory and decoding unit 13. Other paths 1 to 4 are only used to transfer data directly to another path memory. The survivor memory and decoding unit 13 employs a decision circuit 131, which may be a majority vote circuit, to vote the majority of bit value of the ending bits of six survivor paths as decoded data for output.

U.S. Pat. No. 6,148,431 titled "Add compare select circuit and method implementing a Viterbi algorithm" disclosed an ACS circuit with parallel process in the adder and comparator. In this architecture, the trellis diagram must satisfy the condition that the branch metrics for the ACS unit have to be equal. That is, the ACS unit in the U.S. Pat. No. 6,148,431 is not an ACS unit for general purpose.

In general, the conventional ACS unit is the bottleneck of processing speed of the Viterbi decoder, and the ACS processor of the ACS unit cannot increase the processing speed by way of direct pipelining or parallel processing.

SUMMARY OF THE INVENTION

In view of the above-mentioned problems, an object of the invention is to provide a Viterbi decoder capable of changing the processing order of the ACS processor to make the add and compare units of the ACS processor process in parallel, thereby increasing the processing speed of the Viterbi decoder.

To achieve the above-mentioned object, the invention provides a Viterbi decoder consisting of a branch metric generator, a plurality of ACS units, and a survivor memory and decoding unit. The ACS unit comprises: two registers for storing two previous candidate state metrics; and a ACS processor for receiving the previous candidate state metrics stored in the state registers and a first branch metric, generating a first output candidate state metrics.

The ACS processor comprises a first adder, a second adder, a comparator and a first multiplexer. The first adder adds the value stored in the first register and a first branch metric to generate a first addition result. The second adder adds the value stored in the second register and the first branch metric to generate a second addition result. The comparator compares the values stored in the first register and the second register, and outputs a comparison signal as the decision bit. The first multiplexer selects either the first addition result or the second addition result as the first output candidate state metric according to the comparison signal.

The ACS processor can further comprise a third adder, a fourth adder, and a second multiplexer. The third adder adds the value stored in the first register and a second branch metric to generate a third addition result. The fourth adder adds the value stored in the second register and the second branch metric to generate a fourth addition result. The second multiplexer selects either the third addition result or the fourth addition result as a second output candidate state metric according to the comparison signal of the comparator.

Due to the parallel processing of the adders and the comparator of the ACS processor, the processing speed of the Viterbi decoder is increased.

BRIEF DESCRIPTION OF THE DRAWINGS

FIG. 7 shows the circuit of the ACS processor of the invention, wherein FIG. 7(A) shows an adder arranged in back of a multiplexer, while

DETAILED DESCRIPTION OF THE INVENTION

The Viterbi decoder of the invention will be described with reference to the accompanying drawings.

Figure 1A:
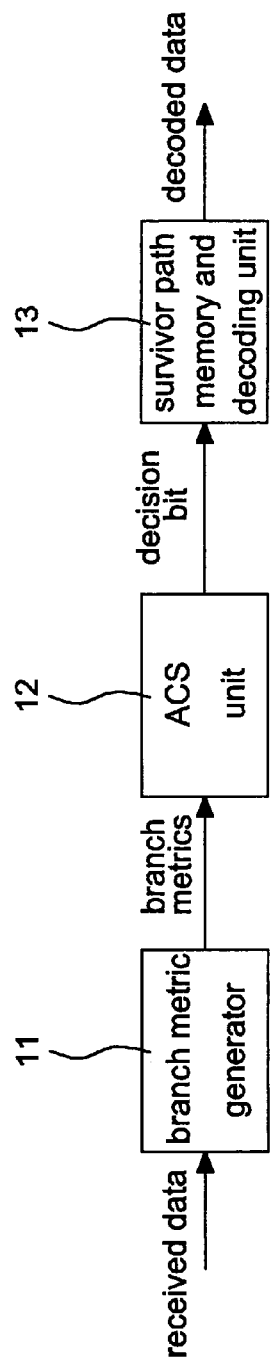
FIG. 1(A) is a block diagram showing a conventional Viterbi decoder.
Figure 1B:
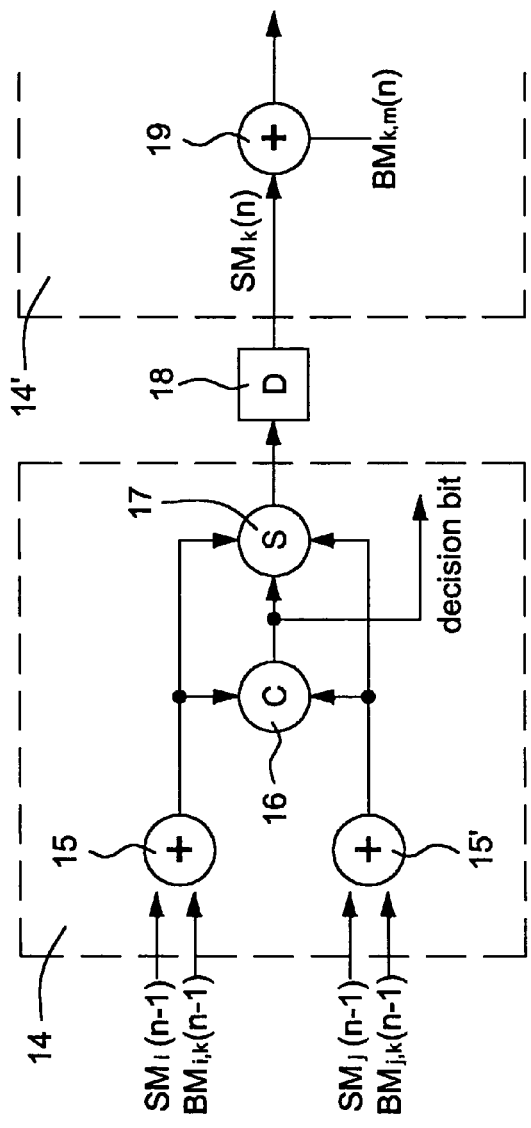
FIG. 1(B) is an architecture diagram showing the ACS processor in the ACS unit of FIG. 1(A).

First, please refer back to FIG. 1(B). In the architecture of the ACS processor of a conventional Viterbi decoder, an adding process is firstly executed, and then a compare-select unit is utilized to select the corresponding data to be outputted to the register. That is, the operation order is add→compare→select. Consequently, parallel processing of the adder and comparator can not be directly executed in this architecture. In view of this, the invention rearranges the operation order of the ACS processor to make the adder and comparator process in parallel to increase the processing speed of the ACS processor.

Figure 6:
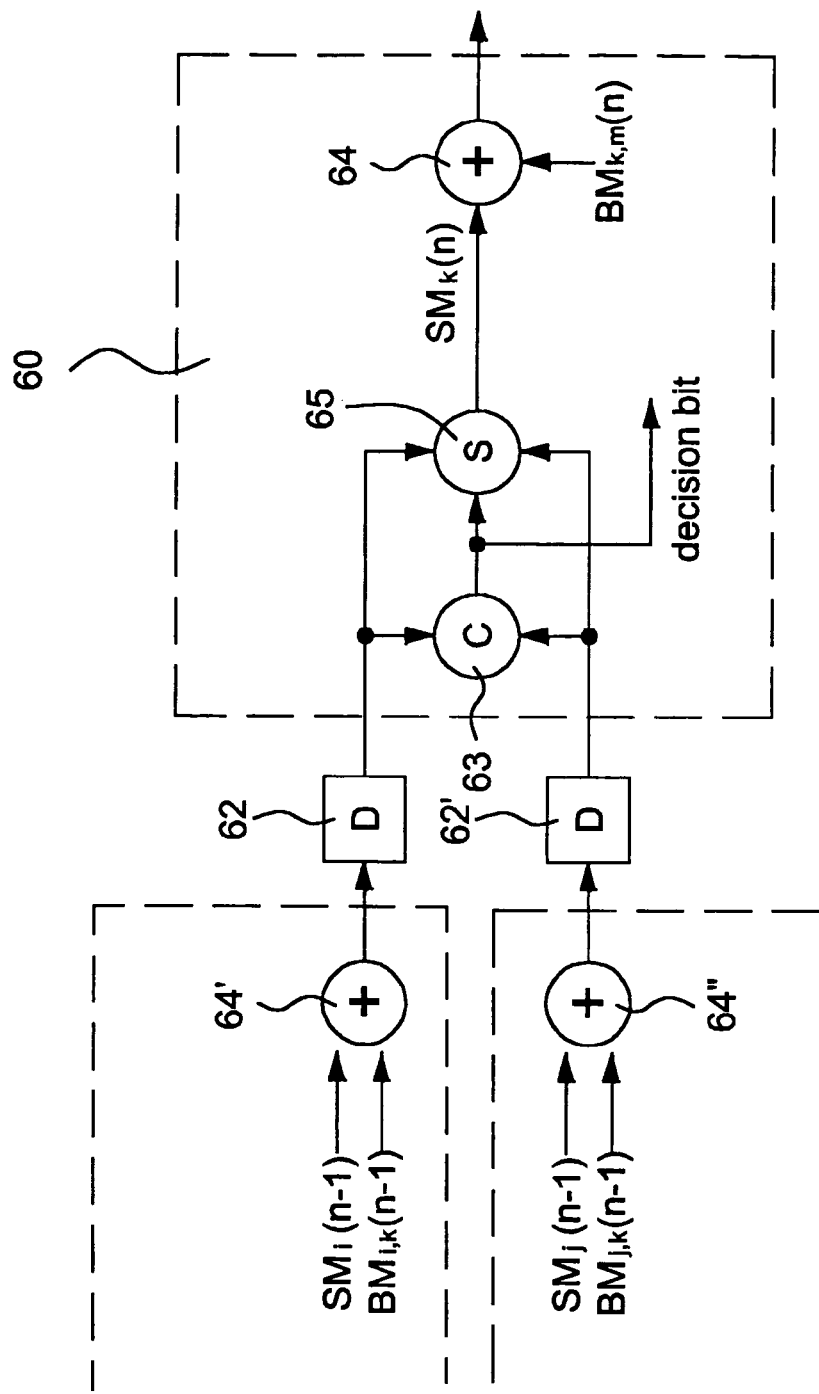
FIG. 6 is an architecture diagram showing the ACS processor in which the operation order is rearranged.

FIG. 6 is an architecture diagram showing an ACS processor of the present invention in which the operation order is rearranged. Referring to FIG. 6, the ACS processor 60 includes a comparator 63, a selector 65 and an adder 64. Compared with FIG. 1(B), the present invention moves the state metric register forward from the location behind the selector into the location before the comparator, which has to add an extra state metric register. That is, each ACS unit in the present invention needs more state metric register. The comparator 63 receives the signals from the two state metric registers 62, 62' and outputs a decision bit. Then the selector 65 selects one of the signals from the two state metric registers 62, 62' according to the decision bit and outputs a new state metric. Finally, the adder 64 adds the state metric outputted from the selector 65 with a branch metric and outputs the result to another metric registers (not shown). Therefore, the operation order of the ACS processor 60 is changed into compare→select→add, which is different from the conventional operation order of add→compare→select.

Figure 7A:
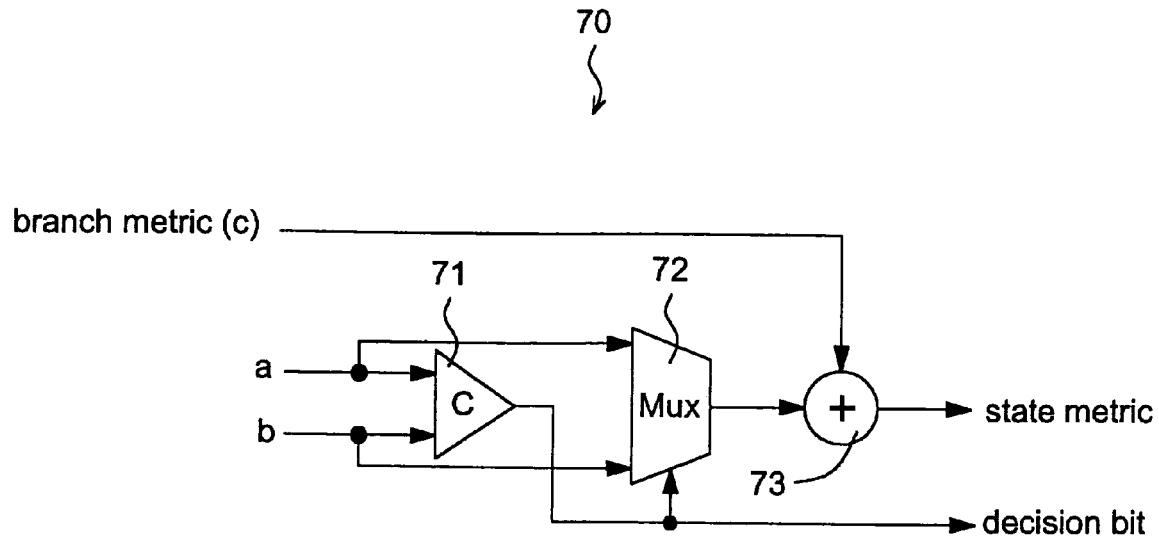
Figure 7B:
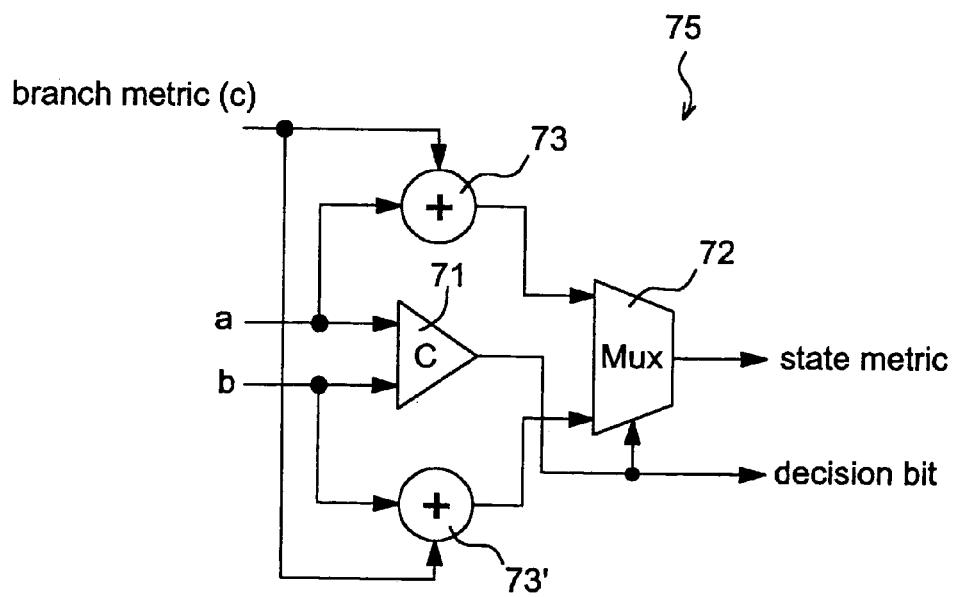
FIG. 7(B) shows two adders arranged in front of a multiplexer.

FIG. 7 shows the circuit of the ACS processor of the invention, wherein FIG. 7(A) shows an adder arranged in back of a multiplexer, while FIG. 7(B) shows two adders arranged in front of a multiplexer. As shown in FIG. 7(A), the ACS processor 70 utilizes the comparator 71 to compare the values of two candidate state metrics (a, b) and to generate a decision bit, and utilizes the multiplexer 72 to select a smaller candidate state metric as a survivor state metric according to the decision bit. The candidate state metrics (a, b) are stored in different state registers, respectively. Then, the adder 73 is utilized to add together the selected survivor state metric and the branch metric (c) to generate a new candidate state metric, which is sent to another ACS processor. Therefore, the output value O of the ACS processor 70 is:

$$O=\min(a,b)+c \qquad (1).$$

Substituting the branch metric (c) of Equation (1) into the min function, Equation (1) is converted into Equation (2):

$$O=\min(a+c,b+c) \qquad (2)$$

FIG. 7(B) shows the circuit of the ACS processor generated according to Equation (2). As shown in the drawing, because the adders 73 are moved to positions in front of the multiplexer 72 in the ACS processor 75, an extra adder 73' is added, and the adders 73, 73' and comparator 71 can perform parallel processing. Consequently, the ACS processor 75 has the processing speed defined as (delay time of the adder+delay time of the multiplexer), or (delay time of the comparator+delay time of the multiplexer), which is quicker than the processing speed defined as (delay time of the adder+delay time of the comparator+delay time of the multiplexer) of prior art. In general, the delay time of the adder substantially equals to the delay time of the comparator. Therefore, when the bit length of the state metric is so long that the delay time of the multiplexer can be neglected, the processing speed of the ACS processor 75 can be substantially doubled.

Figure 8:
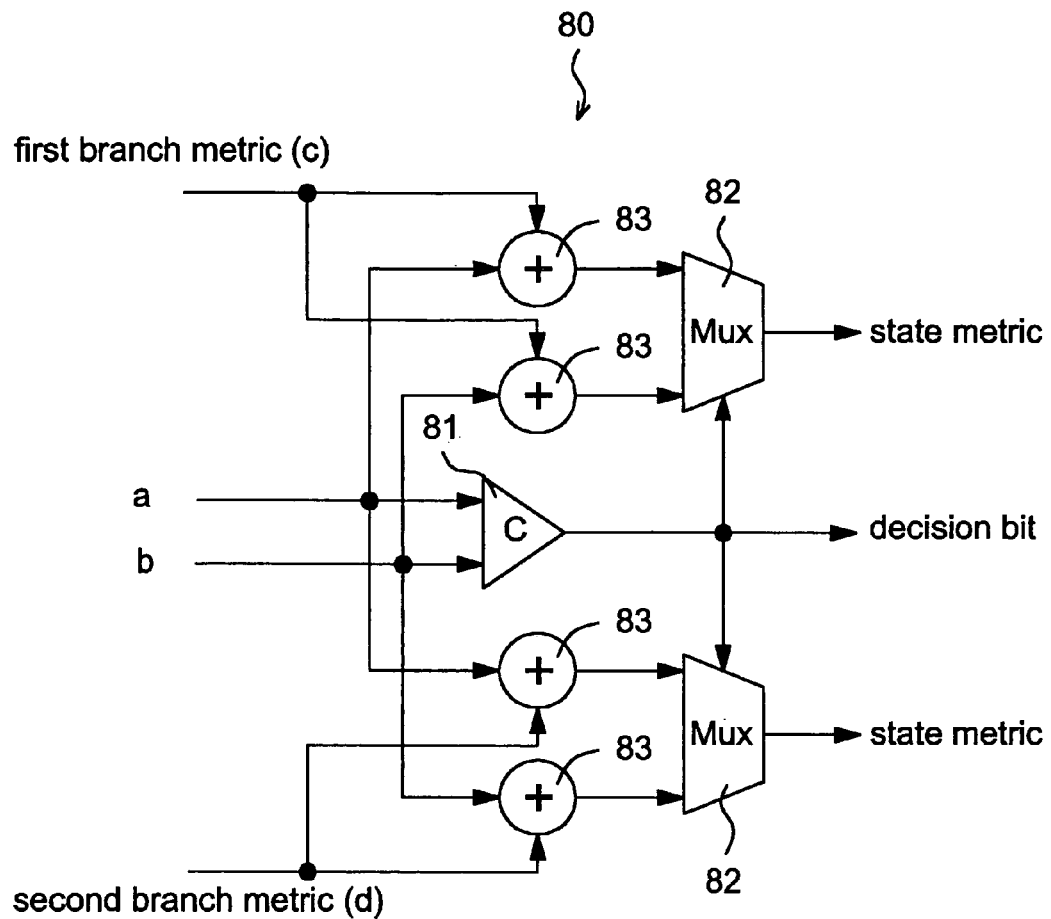
FIG. 8 shows the circuit of the PACS unit related to a state with two output branches.

FIG. 8 shows the circuit of the PACS unit related to a state with two output branches. Compared to FIG. 7, it outputs two candidate state metrics of two output branches. The PACS unit 80 shown in FIG. 8 includes a comparator 81, two multiplexers 82 and four adders 83. That is, the PACS unit 80 includes an extra multiplexer 82 and two extra adders 83 with respect to the PACS unit 75.

Figure 2A:
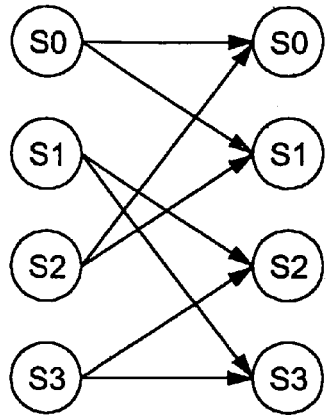
FIG. 2(A) shows an example of the 4-state trellis diagram.
Figure 2B:
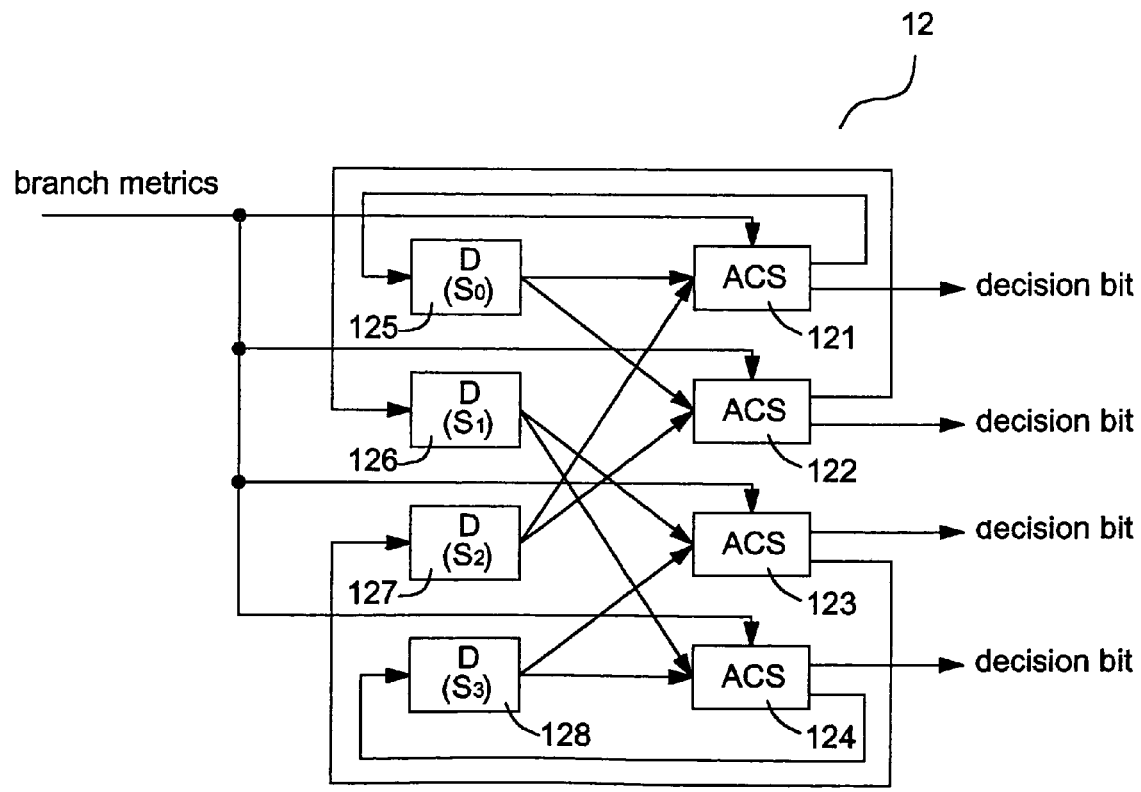
FIG. 2(B) is a block diagram showing the ACS unit of the Viterbi decoder corresponding to the trellis diagram of FIG. 2(A).
Figure 3:
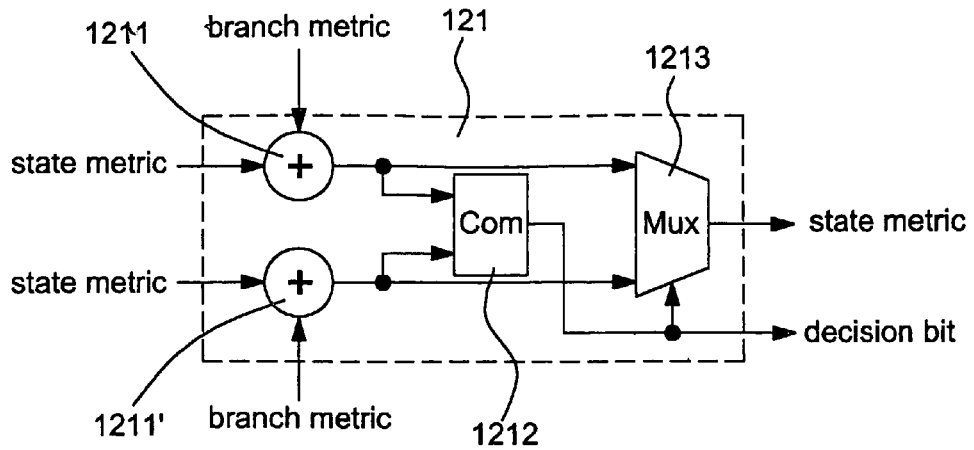
FIG. 3 shows the circuit of the ACS processor of FIG. 2(B).
Figure 9:
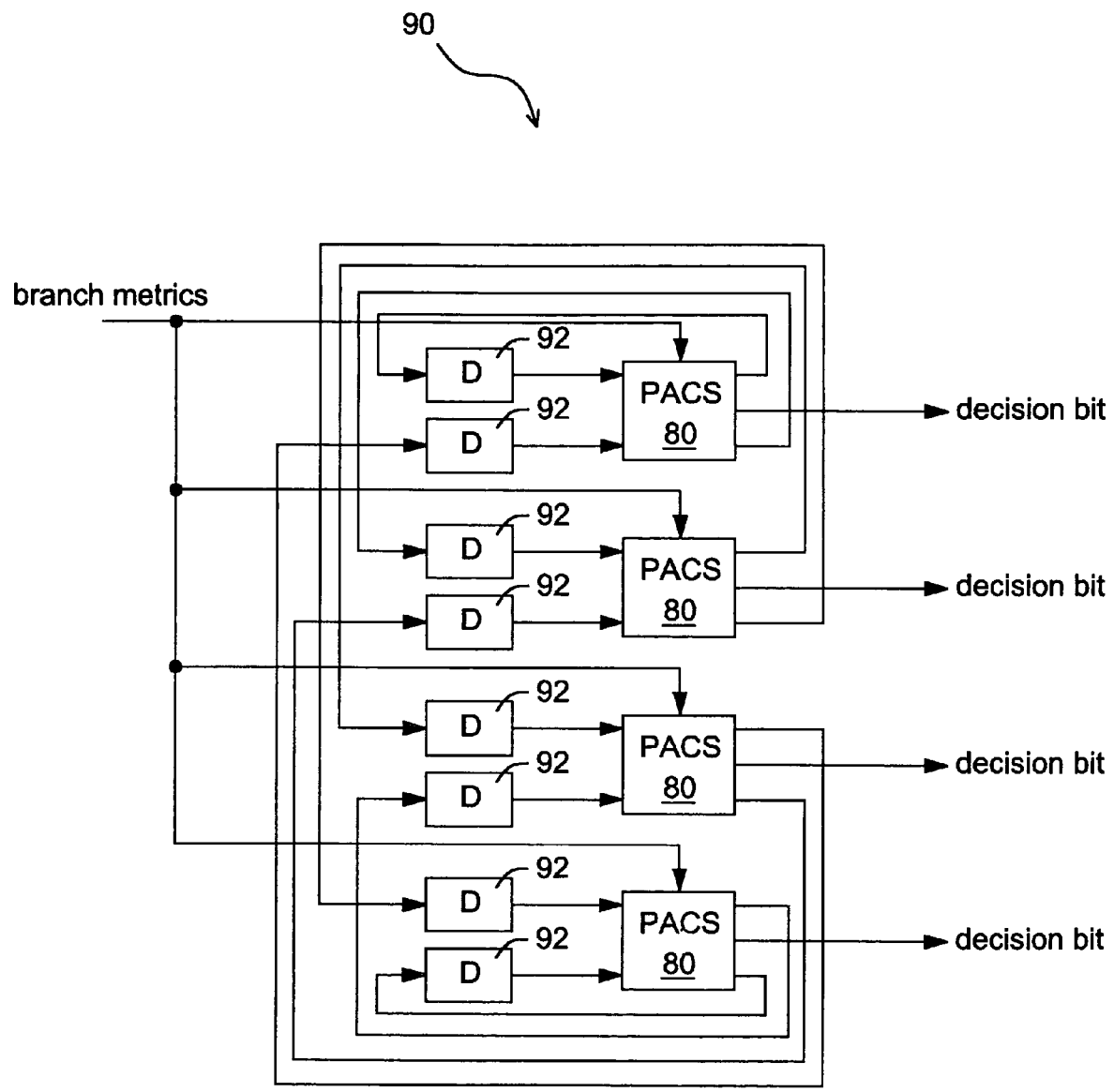
FIG. 9 is a block diagram showing an ACS unit of the Viterbi decoder according to a first embodiment of the invention.

FIG. 9 is a block diagram showing an ACS unit of the Viterbi decoder according to a first embodiment of the invention. The Viterbi decoder as shown in FIG. 9 will be described taking the 4-state trellis diagram of FIG. 2(A) as an example. The ACS unit 90 includes four PACS (parallel Add-Compare-Select) unit 80 for parallel processing, and eight state registers 92 for storing state metrics. That is, each state branch needs two state registers 92 and a PACS unit 80. The two candidate state metrics outputted from each PACS unit 80 of the ACS unit 90 are outputted to two state registers 92.

Figure 4A:
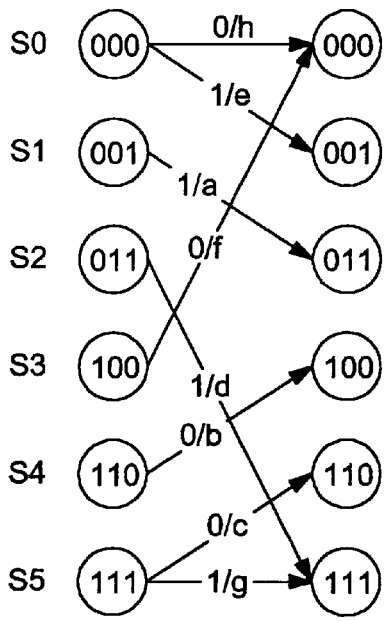
FIG. 4(A) shows a simplified trellis diagram obtained according to the RLL of the EFM signal.
Figure 4B:
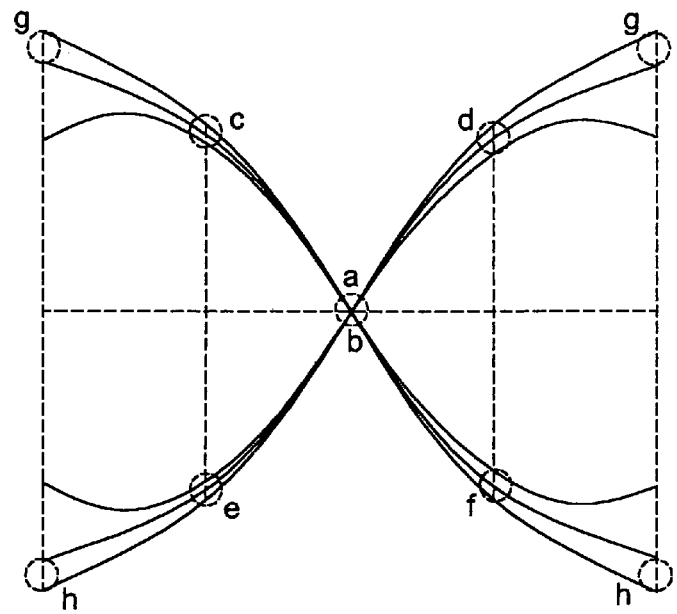
FIG. 4(B) is a schematic illustration showing the branch values corresponding to the trellis diagram of FIG. 4(A).
Figure 5:
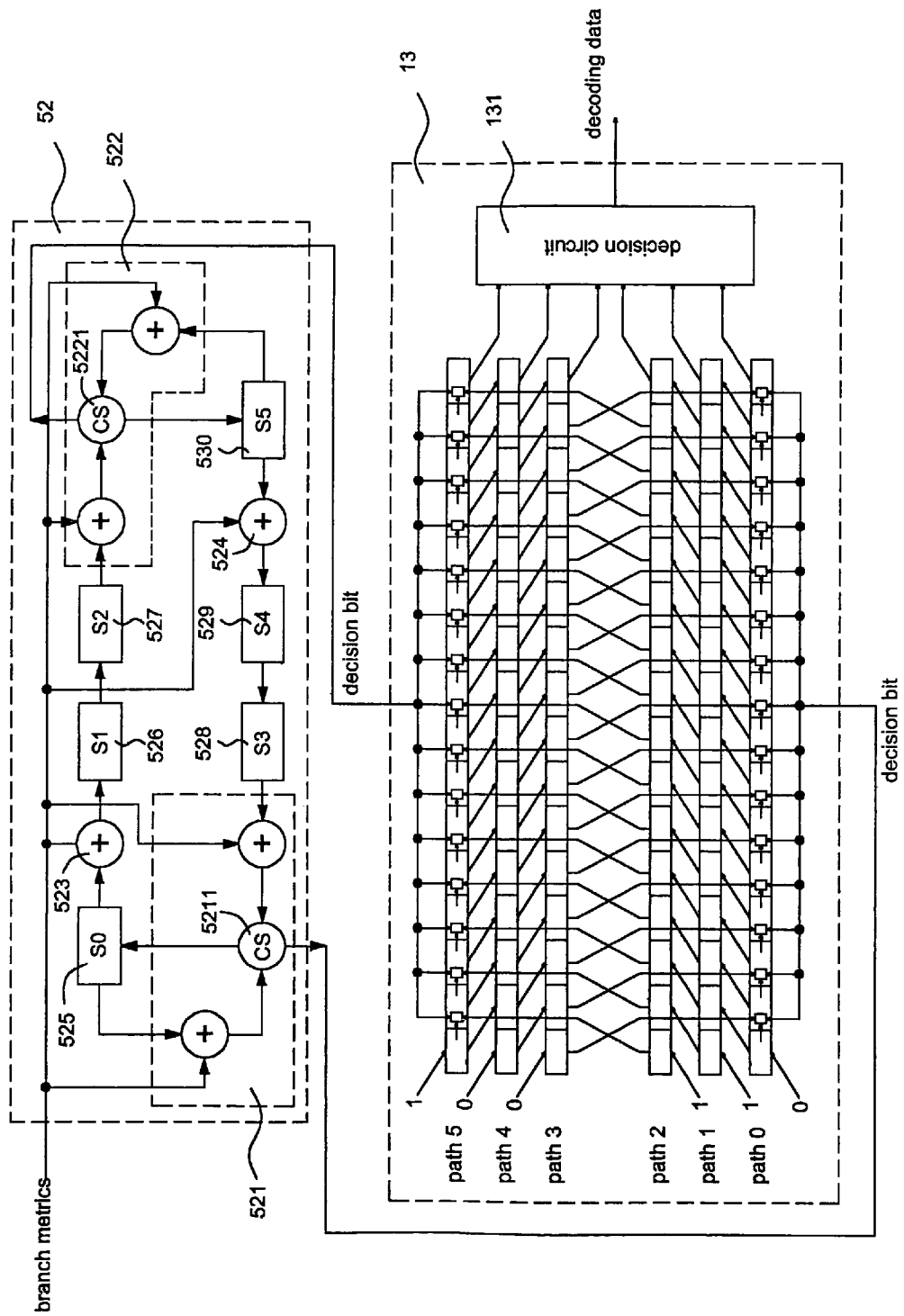
FIG. 5 is an architecture diagram showing a typical Viterbi decoder applied to the trellis diagram of FIG. 4(A).
Figure 10A:
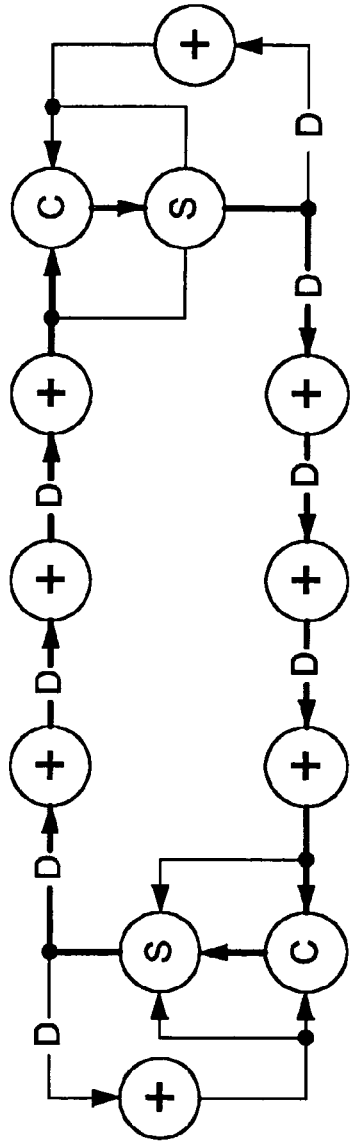
FIG. 10(A) shows a data flow diagram of the typical ACS unit according to the trellis diagram of FIG. 4(A).
Figure 10B:
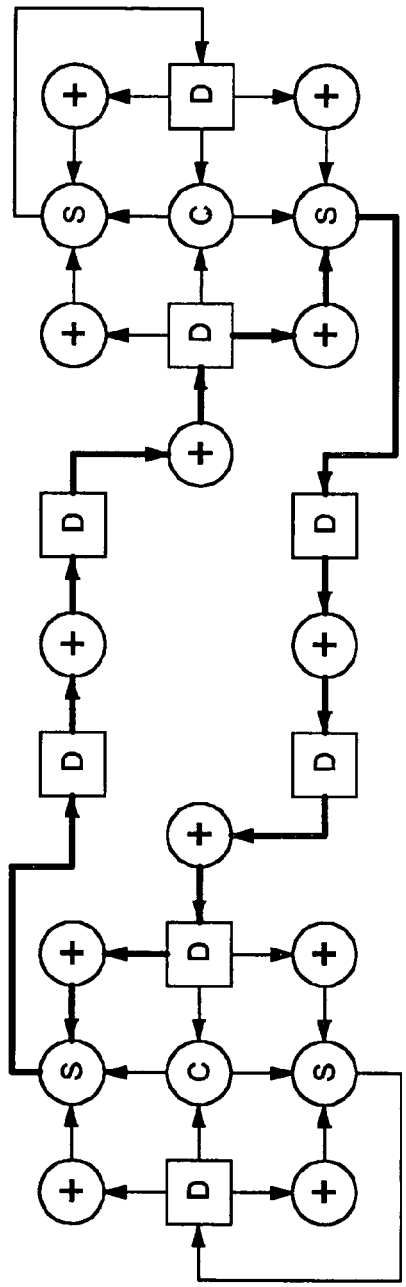
FIG. 10(B) shows a data flow diagram of the ACS unit of the present invention according to the trellis diagram of FIG. 4(A).

FIG. 10 shows the data flow diagram of the ACS unit generated according to the trellis diagram of FIG. 4(A), wherein FIG. 10(A) shows the data flow diagram of the conventional ACS unit, while FIG. 10(B) shows the data flow diagram of the ACS unit of the present invention. The bold lines in FIG. 10 denote the main data flow. As shown in the FIG. 10(A), the data from the register D must pass through the adder, the comparator, and then the selector. On the other hand, as shown in FIG. 10(B), the data from the register D just passes through the adder and then the selector. In this embodiment, the hardware cost of the invention is increased to 20%~30% of the original cost. However, the speed is substantially doubled. Therefore, the invention's ACS unit can effectively shorten the data processing time of the ACS processor, thereby increasing the data processing speed of the ACS unit.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. A Viterbi decoder for decoding a string of data, a trellis structure in the Viterbi decoder containing N trellis states with two-branches and K trellis states with only one branch, wherein N and K are positive integers, the Viterbi decoder comprising:

a branch metric generator for calculating and outputting branch metrics for each branch;

an add-compare-select unit for receiving the branch metrics and previous candidate state metrics respective to the trellis state in the trellis structure and outputting N comparison signals;

wherein the add-compare-select unit comprises:

(2N+K) registers for storing the previous candidate state metrics respective to the trellis state;

N add-compare-select processors for receiving values stored in the 2N first registers and corresponding branch metrics, and outputting N candidate state metrics and the N comparison signals; and wherein each add-compare-select processor comprises:

a first adder for adding a first value stored in one of the registers and a first branch metric to generate a first addition result;

a second adder for adding a second value stored in another of the registers and the first branch metric to generate a second addition result;

a comparator for comparing the first value and the second value, and outputting a comparison signal; and a selector for selecting either the first addition result or the second addition result as the candidate state metric according to the comparison signal;

wherein each add-compare-select processor is configured with the registers being located before the comparator.

2. The Viterbi decoder of claim 1, wherein the Viterbi decoder is used for decoding the string of data using partial response maximum likelihood with run-length code constraint in an optical storage system.

3. A Viterbi decoder for decoding a string of data, a trellis structure in the Viterbi decoder containing N trellis states with two-branches and K trellis states with only one branch, wherein N and K are positive integers, the Viterbi decoder comprising:

a branch metric generator for calculating and outputting branch metrics for each branch;

an add-compare-select unit for receiving the branch metrics and previous candidate state metrics respective to the trellis state in the trellis structure and outputting N comparison signals;

wherein the add-compare-select unit comprises:

(2N+K) registers for storing the previous candidate state metrics respective to the trellis state;

N add-compare-select processors for receiving values stored in the 2N first registers and corresponding branch metrics, and outputting N first candidate state metrics, N second candidate state metrics and the N comparison signals;

wherein each add-compare-select processor comprises:

a first adder for adding a first value stored in one of the registers and a first branch metric to generate a first addition result;

a second adder for adding a second value stored in another of the registers and the first branch metric to generate a second addition result;

a third adder for adding the first value and a second branch metric to generate a third addition result;

a forth adder for adding the second value and the second branch metric to generate a fourth addition result;

a comparator for comparing the first value and the second value, and outputting a comparison signal;

a first selector for selecting either the first addition result or the second addition result as the first candidate state metric according to the comparison signal; and a second selector for selecting either the third addition result or the fourth addition result as the second candidate state metric according to the comparison signal;

wherein each add-compare-select processor is configured with the registers being located before the comparator.

4. The Viterbi decoder of claim 3, wherein the Viterbi decoder is used for decoding the string of data using partial response maximum likelihood with run-length code constraint in an optical storage system.

5. A decoding method of a Viterbi decoder for decoding a string of data, a trellis structure in the Viterbi decoder containing N trellis states with two-branches and K trellis states with only one branch, wherein N and K are positive integers, the Viterbi decoder having a branch metric generator and an add-compare-select unit, the add-compare-select unit having (2N+K) registers and N add-compare-select processors, the method comprising the steps of:

calculating and outputting branch metrics for each branch by the branch metric generator;

adding 2N previous candidate state metrics respective to a trellis state in the trellis structure and a first branch metric from the trellis state, respectively, to generate N first addition results and N second addition results by the add-compare-select processor;

comparing the 2N previous candidate state metrics, and outputting N comparison signals by the add-compare-select processor;

selecting N candidate state metrics from the N first addition results and the N second addition results according to the N comparison signals by the add-compare-select processor;

wherein the adding step and the comparing step are executed concurrently.

6. The decoding method of claim 5, wherein the decoding method is used for decoding the string of data using partial response maximum likelihood with run-length code constraint in an optical storage system.

7. A decoding method of a Viterbi decoder for decoding a string of data, a trellis structure in the Viterbi decoder containing N trellis states with two-branches and K trellis states with only one branch, wherein N and K are positive integers, the Viterbi decoder having a branch metric generator and an add-compare-select unit, the add-compare-select unit having (2N+K) registers and N add-compare-select processors, the method comprising the steps of:

calculating and outputting branch metrics for each branch by the branch metric generator;

adding 2N previous candidate state metrics respective to a trellis state in the trellis structure and a first branch metric from the trellis state, respectively, to generate N first addition results and N second addition results, and adding the 2N previous candidate state metrics and a second branch metric from the trellis state, respectively, to generate N third addition results and N fourth addition results by the add-compare-select processor;

comparing 2N previous candidate state metrics, and then outputting N comparison signals by the add-compare-select processor;

selecting N first candidate state metrics from the N first addition results and the N second addition results, and selecting N second candidate state metrics from the N third addition results and the N fourth addition results according to the N comparison signals by the add-compare-select processor; and wherein the adding step and the comparing step are executed concurrently.

8. The decoding method of claim 7, wherein the decoding method is used for decoding the string of data using partial response maximum likelihood with run-length code constraint in an optical storage system.

* * * * *